United States Patent
Kurtulus et al.

(10) Patent No.: US 12,100,868 B1
(45) Date of Patent: Sep. 24, 2024

(54) SYSTEMS AND METHODS FOR MACHINE LEARNING ENABLED FAULT DETECTION IN RECHARGEABLE BATTERIES

(71) Applicant: Eatron Technologies Limited, Warwick (GB)

(72) Inventors: Can Kurtulus, Istanbul (TR);
Muharrem Ugur Yavas, Istanbul (TR);
Resul Dagdanov, Ankara (TR)

(73) Assignee: Eatron Technologies Limited, Warwick (GB)

( * ) Notice: Subject to any disclaimer, the term of this patent is extended or adjusted under 35 U.S.C. 154(b) by 0 days.

(21) Appl. No.: 18/338,656

(22) Filed: Jun. 21, 2023

(51) Int. Cl.
*H01M 6/50* (2006.01)

(52) U.S. Cl.
CPC ....... *H01M 6/5033* (2013.01); *H01M 6/5044* (2013.01)

(58) Field of Classification Search
None
See application file for complete search history.

(56) References Cited

U.S. PATENT DOCUMENTS

| | | |
|---|---|---|
| 9,467,515 B1 | 10/2016 | Penilla |
| 11,527,786 B1 | 12/2022 | Budan |
| 11,626,628 B1 * | 4/2023 | Budan ............... H01M 10/486 701/106 |
| 11,658,356 B1 | 5/2023 | Budan |
| 11,705,590 B1 | 7/2023 | Budan |
| 2019/0036178 A1 | 1/2019 | Karner |
| 2019/0391587 A1 | 12/2019 | Uvarov |
| 2024/0168093 A1 * | 5/2024 | Kong ............... G01R 31/392 |

OTHER PUBLICATIONS

ISRWO, PCT/EP2023/078772, mailed Feb. 26, 2024.
Kiran Bhaskar et al: "Data-Driven Thermal Anomaly Detection in Large Battery Packs", arxiv.org, Cornell University Library, 201 Olin Library Cornell University Ithaca, NY 14853, Jan. 20, 2023 (Jan. 20, 2023), XP091418029, DOI: 10.3390/BATTERIES9020070 figure 1.

* cited by examiner

*Primary Examiner* — Vincent Q Nguyen
(74) *Attorney, Agent, or Firm* — Dickinson Wright PLLC; Jonathan H. Harder

(57) ABSTRACT

In one aspect, computer-implemented method may include receiving, from one or more sensors associated with a battery pack, one or more measurements pertaining to voltage, temperature, or both. The method may include transforming the one or more measurements into a time-series sequential window format, determining, based on the time-series sequential window format of the one or more measurements, a voltage score and a temperature score, and predicting, based on the voltage score and the temperature score, whether the battery pack is experiencing a fault condition. The prediction is performed by one or more trained machine learning models. Responsive to predicting the battery pack is experiencing the fault condition, the method may include performing one or more preventative actions.

20 Claims, 11 Drawing Sheets

SYSTEMS AND METHODS FOR MACHINE LEARNING ENABLED FAULT DETECTION IN RECHARGEABLE BATTERIES

TECHNICAL FIELD

This disclosure relates generally to assets and batteries. More specifically, this disclosure relates to systems and methods for machine learning enabled fault detection in rechargeable batteries.

BACKGROUND

Rechargeable batteries may be prone to faults, and this issue may be particularly prevalent in electric vehicles due to their substantial volume and weight. Battery faults in electric vehicles may result in operational disruptions and/or undesirable events. Similarly, a battery fault that occurs for rechargeable batteries used in mobile phones, laptops, and other devices (e.g., vacuum cleaner) can render these devices inoperable in some instances. Further, battery faults may become hazardous during a battery charging process.

SUMMARY

In one aspect, a computer-implemented method may include receiving, from one or more sensors associated with a battery pack, one or more measurements pertaining to voltage, temperature, or both. The method may include transforming the one or more measurements into a time-series sequential window format. The method may include determining, based on the time-series sequential window format of the one or more measurements, a voltage score and a temperature score. The method may include predicting, based on the voltage score and the temperature score, whether the battery pack is experiencing a fault condition, wherein the prediction is performed by one or more trained machine learning models. Responsive to predicting the battery pack is experiencing the fault condition, the method may include performing one or more preventative actions.

In one aspect, a computer-implemented method may include receiving, at a cloud-based computing system, a set of measurements over a certain period of time, wherein the set of measurements are received from a set of vehicles and pertain to voltages and temperatures of a set of battery packs associated with the set of vehicles. The method may include training, using the set of measurements, one or more machine learning models to predict a battery pack fault condition, wherein the one or more machine learning models include a set of parameters that are modified during the training. The method may include transmitting the set of parameters to the set of vehicles to enable the set of vehicles to update, based on the set parameters, one or more respective in-vehicle machine learning models configured to predict the battery pack fault condition.

In another aspect, one or more tangible, non-transitory computer-readable media may store instructions and one or more processing devices may execute the instructions to perform one or more operations of any method disclosed herein.

In another aspect, a method may include one or more operations implemented by computer instructions and performed by one or more processing devices to perform the techniques disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication. The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

Figure 1:
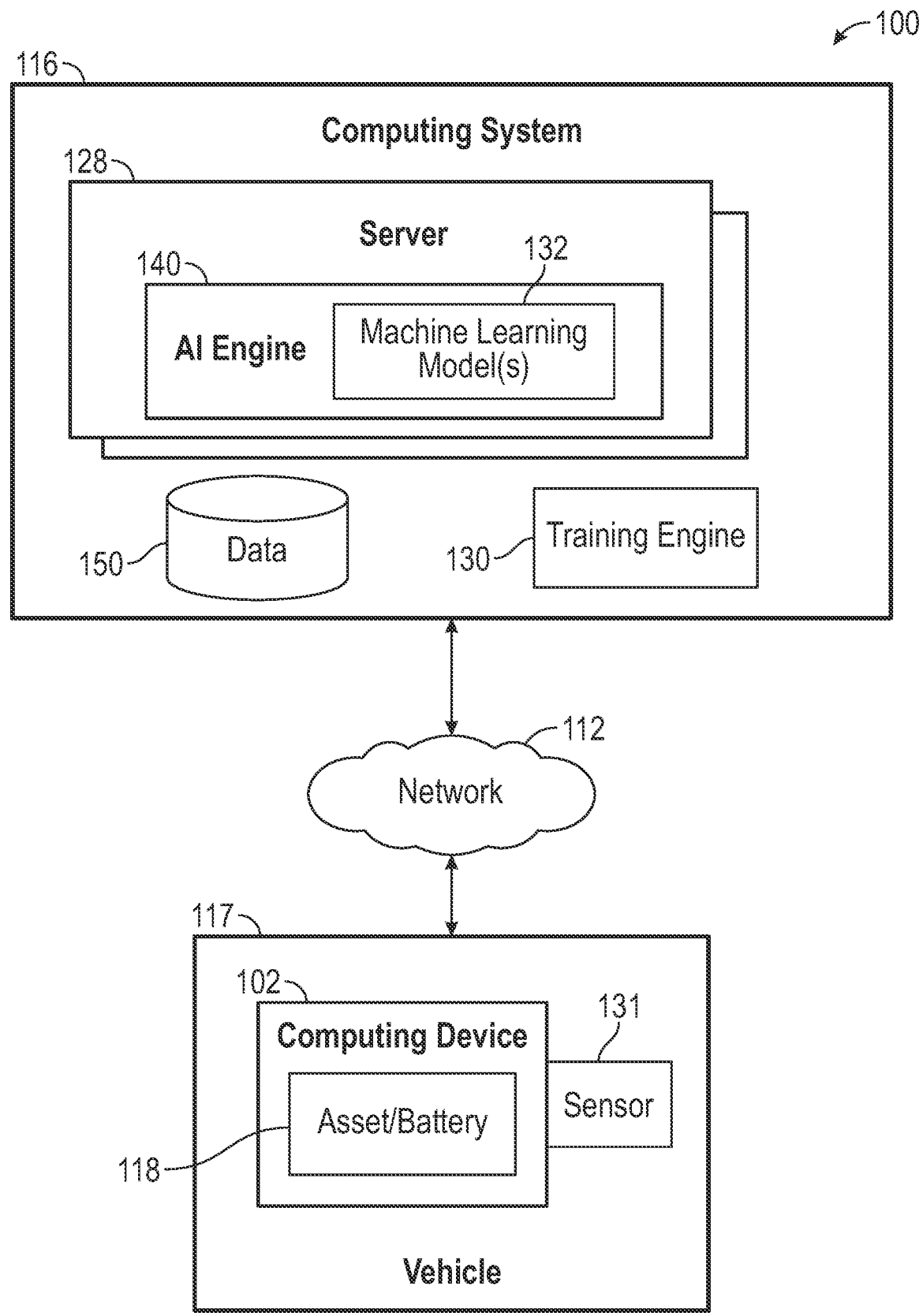
FIG. 1 illustrates a high-level component diagram of an illustrative system architecture according to certain embodiments of this disclosure.

Detecting battery faults early may allow for timely battery pack or cell maintenance, repair, and/or replacement. Such maintenance, repair, and/or replacement may enable continued device functionality. Conventional detection methods may be categorized in two ways: model-based approaches and data-based approaches. Each method has its shortcomings. For example, model-based fault diagnosis may rely on battery models to generate residuals, which are monitored and analyzed to detect faults. In some instances, internal short circuits or thermal faults may be modeled, and thresholds may be estimated. These diagnosis methods may depend on accuracy of developed models and estimated thresholds and often lack real-time sensor data from a diverse array of batteries. Non-model based methods may include signal processing and knowledge-based techniques which rely on battery data collection and define faults as based on unusual data. The data-based methods do not consider variations in cell chemistries and applications, and they do not compare cells within a battery pack in real-time. Further, the data-based methods may not collect data from large battery populations such as fleet vehicles.

Accordingly, some embodiments of the present disclosure provide machine learning enabled fault detection for rechargeable batteries. In some embodiments, multiple voltage and temperature sensor data may be obtained from sensors of a battery pack and may be used to determine a battery fault condition using one or more trained machine learning models executed by a computing device of a vehicle. The sensor measurement data may be transmitted to a cloud-based computing system for further analysis and updating of machine learning model parameters. The cloud-based computing system may execute one or more machine learning models trained based on fleet level sensor measurements related to battery packs of a large population of vehicles. The one or more machine learning models of the cloud-based computing system may be trained via supervised learning with data labeled as a battery fault condition or as a healthy battery. The cloud-based computing system may store the sensor measurements of each fleet vehicle independently in one or more memory devices. In some embodiments, one or more scores (e.g., z-score) may be determined for the temperature and voltage of a battery pack during charging. The one or more scores may be used to predict whether the battery pack is experiencing a fault condition and may be used to identify cell-to-cell variations in the battery pack. In some embodiments, sensor measurements from each cell may be compared with each other to determine whether the battery pack is experiencing a fault condition. The sensor measurements may be transformed into a time-series sequential window format that is compressed from a higher dimensional level to a lower dimensional level. The lower dimensional level data may be used to determine a battery fault condition. In some embodiments, the parameters of the one or more machine learning models executed by the cloud-based computing system may be transmitted to each vehicle in a fleet and may be used to update the one or more machine learning models executed by computing devices of the vehicles.

A battery pack may include cells arranged in modules. Some embodiments of the present disclosure may enable detecting faults at the cell level, the module level, and/or the pack level. Accordingly, once a fault is detected at the cell and/or module level, some embodiments of the present disclosure may enable performing granular preventative actions, such as replacing a cell and/or module, repairing a cell and/or module, and the like.

In some embodiments, the present disclosure may apply to electric vehicle battery packs. In some embodiments, the presently disclosed techniques generally related to using multiple sensors and artificial intelligence models to detect faults and analyze data may be applied to any industrial field that uses battery or power storage systems. For example, some embodiments may be used in industries such as renewable energy, telecommunications, aerospace, laptops, mobile phones, home devices, among other things.

FIGS. 1 through 11, discussed below, and the various embodiments used to describe the principles of this disclosure are by way of illustration only and should not be construed in any way to limit the scope of the disclosure.

FIG. 1 illustrates a high-level component diagram of an illustrative system architecture 100 according to certain embodiments of this disclosure. In some embodiments, the system architecture 100 may include a cloud-based computing system 116, a computing device 102, and a vehicle 117 communicatively coupled via a network 112. The cloud-based computing system 116 may be a real-time software platform, include privacy software or protocols, or include security software or protocols. Each of the computing device 102 and components included in the cloud-based computing system 116 may include one or more processing devices, memory devices, or network interface cards. The network interface cards may enable communication via a wireless protocol for transmitting data over short distances, such as Bluetooth, ZigBee, NFC, etc. Additionally, the network interface cards may enable communicating data via a wired protocol over short or long distances, and in one example, the computing device 102 and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IOT).

The computing device 102 may be any suitable computing device, such as an embedded computer device with display, a laptop, tablet, smartphone, or computer. The computing device 102 may be included within a vehicle, such as an electric vehicle. The computing device 102 may include a display capable of presenting a user interface of an application. The application may be implemented in computer instructions stored on the one or more memory devices of the computing device 102 and executable by the one or more processing devices of the computing device 102. The computing device 102 may include an asset and/or battery pack 118, each of which may have a useful life that degrades over time. The asset and/or battery pack 118 may be used to charge and power a vehicle (e.g., electric vehicle), smartphone, appliance, or any suitable device that uses a battery.

The user interface may present various screens to a user that present various views including notifications of when a battery fault condition is detected for one or more battery cells and/or one or more battery packs. The user interface may enable performing a preventive action such as presenting a signal (e.g., warning signal that the battery fault condition is present) and/or changing an operating parameter of the vehicle (e.g., consume less energy from the battery, stop using one or more cells of the battery pack, etc.), and the like. The computing device 102 may also include instructions stored on the one or more memory devices that, when executed by the one or more processing devices of the computing device 102, perform operations of any of the methods described herein.

The vehicle 117 may be any suitable type of vehicle or electric vehicle, such as an automobile, a motorcycle, a boat, an airplane, a bicycle, a scooter, a skateboard, roller skates, roller blades, a unicycle, a surfboard, a drone, or the like. Accordingly, the vehicle 117 may include an engine that is powered by one or more batteries, assets, and motors. The vehicle 117 may also include one or more sensors 131 that are configured to measure any suitable operating parameter of a vehicle, a temperature of the vehicle 117, a vibration of the vehicle 117, a battery pack current, a battery pack cell voltage, a battery pack cell temperature, etc. The sensors 131 may include an accelerometer, a current sensor, a voltage sensor, a temperature sensor, a thermal sensor, a camera, or the like. The processing device of the vehicle 117 may receive the measurements from the one or more sensors 131 and transmit them via the network 112 to the cloud-based computing system 116 for use in training one or more machine learning models 132. In some embodiments, when a machine learning model is trained and ready to process real-time data, the processing device of the vehicle 117 may receive the measurements from the one or more sensors 131 and use them, along with other data (e.g., a user battery usage profile), to predict a fault condition of the battery pack and/or asset 118. The computing device 102 of the vehicle 117 may also execute an instance of a machine learning model 132 that is trained using parameters received from a cloud-based machine learning model 132.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The servers 128 may execute an artificial intelligence engine 140 and one or more machine learning models 132, as described further herein.

That is, the servers 128 may execute an artificial intelligence (AI) engine 140 that uses one or more machine learning models 132 to perform at least one of the embodiments disclosed herein. The cloud-based computing system 116 may also include a database 150 that stores data, knowledge, and data structures used to perform various embodiments. For example, the database 150 may store fleet of electric vehicles' data, battery data (e.g., cell voltage measurements, cell temperature measurements, z-scores, etc.) received from a manufacturer of the battery, lab experiment data pertaining to the battery, user battery usage profile, etc. Although depicted separately from the server 128, in some embodiments, the database 150 may be hosted on one or more of the servers 128.

In some embodiments, the cloud-based computing system 116 may include a training engine 130 capable of generating one or more machine learning models 132. Although depicted separately from the AI engine 140, the training engine 130 may, in some embodiments, be included in the AI engine 140 executing on the server 128. In some embodiments, the AI engine 140 may use the training engine 130 to generate the machine learning models 132 trained to perform inferencing and/or predicting operations. The machine learning models 132 may be trained to predict battery fault conduction occurrence, among other things. The one or more machine learning models 132 may be generated by the training engine 130 and may be implemented in computer instructions executable by one or more processing devices of the training engine 130 or the servers 128. To generate the one or more machine learning models 132, the training engine 130 may train the one or more machine learning models 132. The one or more machine learning models 132 may be used by any of the methods described herein.

The training engine 130 may be a rackmount server, a router, a personal computer, a portable digital assistant, a smartphone, a laptop computer, a tablet computer, a netbook, a desktop computer, an Internet of Things (IOT) device, any other desired computing device, or any combination of the above. The training engine 130 may be cloud-based, be a real-time software platform, include privacy software or protocols, or include security software or protocols.

To generate the one or more machine learning models 132, the training engine 130 may train the one or more machine learning models 132. The training engine 130 may use a base training data set including inputs of labeled data (e.g., assigned a value of 1) associated with battery fault conditions and labeled data (e.g., assigned a value of 0) not associated with battery fault conditions, among other things. One or more combinations of the inputs may be mapped to an output pertaining to an occurrence of a battery fault condition of each cell of the battery pack. The training engine 130 may use supervised learning in some embodiments to train the one or more machine learning models 132. For example, examples of battery data associated with non-faulty battery conditions and detected battery fault conditions may be received from numerous vehicles (e.g., fleet vehicles) and may be labeled accordingly. Such labeled data may be used by the training engine 130 to train the one or more machine learning models 132.

The training may include optimizing one or more parameters of the one or more machine learning models 132. For example, the parameters may include a number of hidden layers, a number of nodes used by each hidden layer, a weight, a type of activation function used, a type of loss function used, a batch size, a pooling size, number of iterations of training, etc. The parameters may be updated as additional sensor measurements are received from the vehicles in the fleet. In some embodiments, the parameters that are modified during training may be selectively transmitted to the computing device 102 of the vehicle, and the computing device 102 may update one or more locally executed machine learning models with the parameters. For example, batteries that exhibit similar characteristics (e.g., cell imbalances, charging rates, depletion rates, etc.) and/or drivers that exhibit similar driving patterns or preferences may be selected for in-vehicle machine learning model parameter updating. Such real-time or near real-time optimizations may enable more efficient and/or accurate detection of battery fault conditions. Accordingly, preventative actions may be performed quicker, thereby reducing wear on the battery pack, preempting battery pack failure, improving performance of the electric vehicle, and the like.

The one or more machine learning models 132 may refer to model artifacts created by the training engine 130 using training data that includes training inputs and corresponding target outputs. The training engine 130 may find patterns in the training data wherein such patterns map the training input to the target output and generate the machine learning models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more machine learning models 132 may comprise, e.g., a single level of linear or non-linear operations (e.g., a support vector machine (SVM) or the machine learning models 132 may be a deep network, i.e., a machine learning model comprising multiple levels of non-linear operations. Examples of deep networks are neural networks, including generative adversarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons. In some embodiments, the one or more machine learning models 132 may be trained via supervised learning, unsupervised learning, and/or reinforcement learning.

Figure 2:
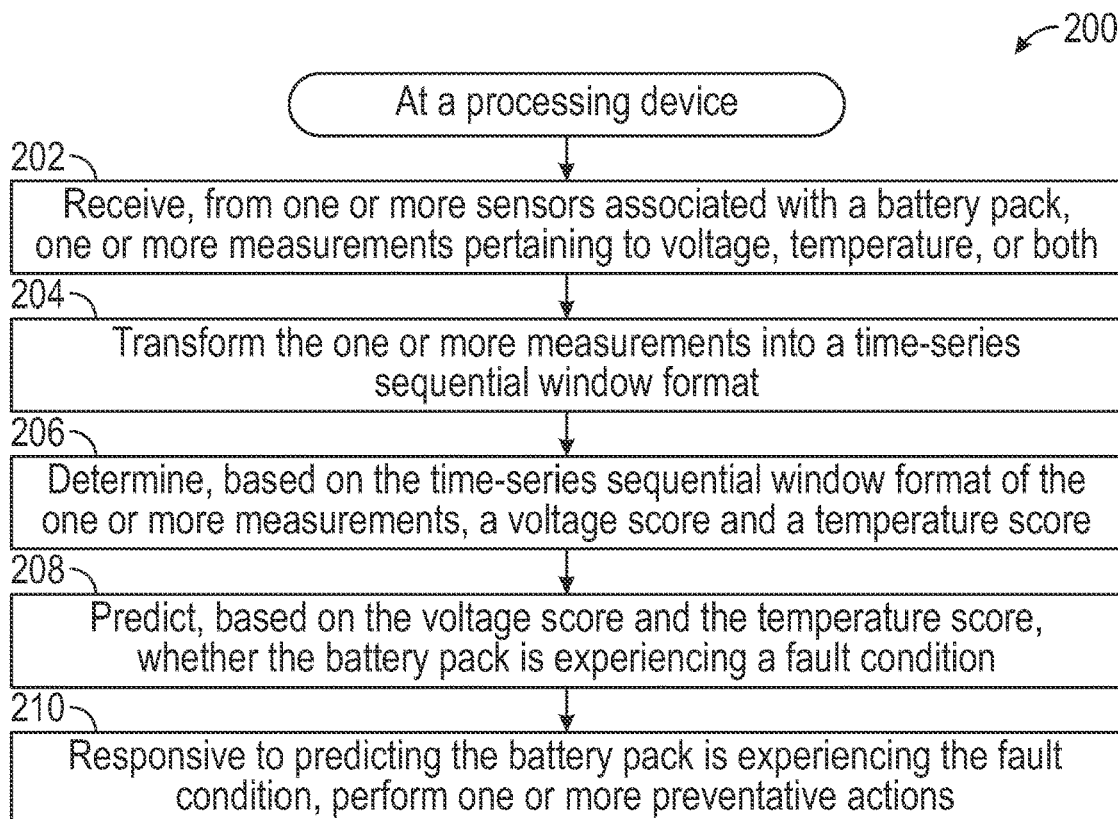
FIG. 2 illustrates example operations of a method for using one or more machine learning models to predict a fault condition according to certain embodiments of this disclosure.

FIG. 2 illustrates example operations of a method for using one or more machine learning models to predict a fault condition according to certain embodiments of this disclosure. The method 200 is performed by processing logic that may include hardware (circuitry, dedicated logic, etc.), software (such as is run on a computer system or specialized dedicated machine), or a combination of both. The method 200 or each of their individual functions, routines, subroutines, or operations may be performed by one or more processors of a computing device (e.g., any component of FIG. 1, such as computing device 102, server 128 executing the artificial intelligence engine 140, etc.). In certain implementations, the method 200 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 200 may be performed by the training engine 130 of FIG. 1.

For simplicity of explanation, the method 200 is depicted and described as a series of operations. However, operations in accordance with this disclosure can occur in various orders or concurrently, and with other operations not presented and described herein. For example, the operations depicted in the method 200 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 202, the processing device may receive, from one or more sensors associated with a battery pack, one or more measurements pertaining to voltage, temperature, or both. In some embodiments, the battery pack may be used to at least partially power a vehicle, a computing device, or both. In some embodiments, the one or more measurements may be received while the battery pack is charging.

At 204, the processing device may transform the one or more measurements into a time-series sequential window format. In some embodiments, the processing device may compress the time-series sequential window flow format of the one or more measurements from a higher dimension level to a lower dimension level.

At 206, the processing device may determine, based on the time-series sequential window format of the one or more measurements, a voltage score and a temperature score. In some embodiments, the voltage score may a z-score and the temperature score may be a z-score. The z-scores may represent cell-to-cell variations in voltage and temperature measurements in the battery pack. The z-scores may be determined based on the following formula:

$$z = \frac{x - \mu}{\sigma}$$

Where x is the raw value, $\mu$ is the population mean, and $\sigma$ is the population standard deviation. As the formula shows, the z-score is simply the raw value minus the population mean, divided by the population standard deviation. Z-scores can be positive or negative. The sign indicates whether the observation is above or below the mean.

At 208, the processing device may predict, based on the voltage score and the temperature score, whether the battery pack is experiencing a fault condition. In some embodiments, the prediction may be performed by one or more trained machine learning models executed by the computing device 102 of the vehicle 117.

At 210, responsive to predicting the battery pack is experiencing the fault condition, the processing device may perform one or more preventative actions. The one or more preventative actions may include scheduling maintenance of the battery pack, repairing the battery pack, replacing the battery pack, or some combination thereof. The preventative action may include transmitting a notification to a user interface of the computing device 102, and the notification may indicate the battery is experiencing a fault condition.

In some embodiments, the battery pack may include a set of cells and the one or more measurements may be received for each of the set of cells. The processing device may compare the one or more measurements for each of the set of cells.

In some embodiments, the processing device may transmit the one or more measurements to the cloud-based computing system 116, which may use the one or more measurements to train one or more cloud-based machine learning models 132 configured to predict the fault condition.

Figure 3:
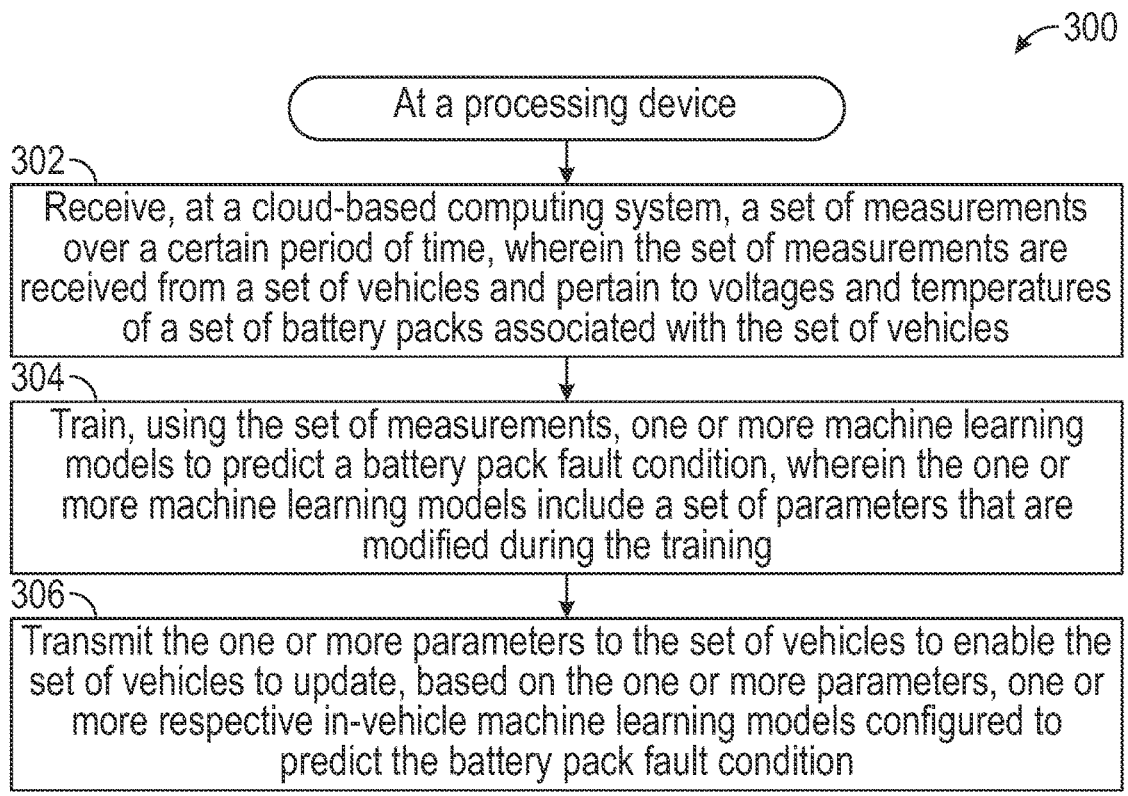
FIG. 3 illustrates example operations of another method for using one or more machine learning models to predict a fault condition according to certain embodiments of this disclosure.

FIG. 3 illustrates example operations of another method for using one or more machine learning models to predict a fault condition according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as server 128 executing the artificial intelligence engine 140, or computing device 102 of the vehicle 117). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 300 may be performed by the training engine 130 of FIG. 1. The method 300 may be performed in a similar manner as the method 200 of FIG. 2.

At 302, the processing device may receive, at a cloud-based computing system 116, a set of measurements over a certain period of time. The set of measurements may be received from a set of vehicles (e.g., fleet vehicles) and may pertain to voltages and temperatures of a set of battery packs associated with the set of vehicles. In some embodiments, the one or more battery packs are used to at least partially power a vehicle, a computing device, or both.

At 304, the processing device may train, using the set of measurements, one or more machine learning models 132 to predict a battery fault condition. The one or more machine learning models may include a set of parameters that are modified during the training. The one or more machine learning models may be trained via the training engine 130 of the cloud-based computing system 116. The one or more machine learning models 132 may be a non-linear 2-layer fully connected neural network, in some embodiments. In some embodiments, the processing device may determine, at the cloud-based computing system 116, one or more voltage scores and one or more temperature scores based on the set of measurements. The one or more voltage and temperature scores may be z-scores used to extract cell-to-cell variations of the set of battery packs.

At 306, the processing device may transmit the set of parameters to the set of vehicles to enable the set of vehicles to update, based on the set of parameters, one or more respective in-vehicle machine learning models (e.g., executed by computing device 102) configured to predict the battery pack fault condition.

In some embodiments, the processing device may compress the set of measurements from higher dimensional level data to lower dimensional level data. In some embodiments, compression of the set of measurements may produce time-variant value change details of the measurements while omitting data that remains the same or does not change. In some embodiments, the processing device may determine, based on the lower dimensional level data, a loss associated with compressing the set of measurements. In some embodiments, the processing device may optimize the set of parameters by back propagation to minimize the loss.

In some embodiments, the processing device may receive a set of fault condition classifications from a set of in-vehicle machine learning models over the network 112. In some embodiments, the processing device may train, using the set of fault condition classifications and the set of measurements, the one or more machine learning models 132 to predict the battery pack fault condition.

Figure 4:
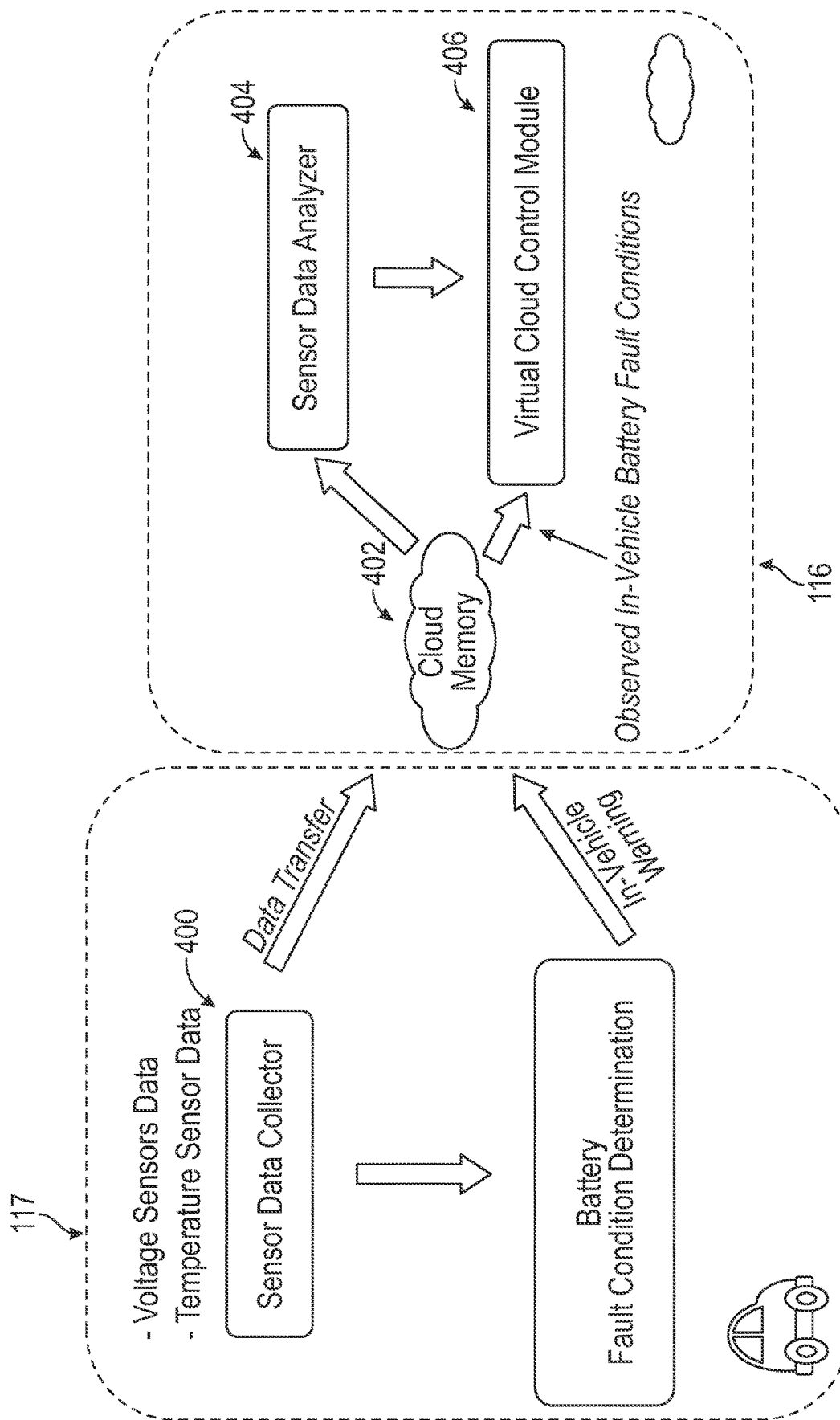
FIG. 4 illustrates an example block diagram for detecting a fault condition at a vehicle and alerting a cloud-based system according to certain embodiments of this disclosure.

FIG. 4 illustrates an example block diagram for detecting a fault condition at a vehicle 117 and alerting a cloud-based system 116 according to certain embodiments of this disclosure. As depicted, a sensor data collector 400 may receive voltage measurement data, temperature measurement data, and any other suitable data from sensors 131. The sensor measurement data may be used for battery fault condition determination, which may be performed by one or more processing devices executed by the computing device 102 of the vehicle 117. In addition, the sensor measurement data may be transmitted (e.g., via network 112) to the cloud-based computing system 116. Each vehicle in a fleet of vehicles may transmit their respective sensor measurement data for individual storage in a cloud memory 402 (e.g., server 128, database 150, etc.).

The battery fault condition determination may be performed by one or more in-vehicle trained machine learning models executed by the computing device 102, for example. As described further herein, the sensor measurement data may be transformed into a time-series window flow format, compressed into a lower dimension, and analyzed to determine statistical scores (e.g., z-scores) that represent cell-to-cell variations within each of the battery packs. In some embodiments, the one or more machine learning models may use at least the z-scores to predict the battery pack fault condition. As depicted, if a battery fault condition is predicted/detected, an in-vehicle warning (e.g., notification) may be transmitted to the cloud-based computing system 116 for further analysis and/or driver behavior determination.

A sensor data analyzer 404 may analyze the received sensor measurement data by formatting it, compressing it, and/or performing any suitable operation on the sensor measurement data. The analyzed data may be transmitted to a virtual cloud control module 406 which may provide insight into the battery fault condition detection performance of the fleet vehicles. For example, processing fleet vehicle data may enable learning that certain conditions of the batteries lead to certain consequences (e.g., when battery charging levels fall below 75 percent of their original capacity, degradation in battery performance accelerates). Each of the sensor data analyzer 404 and the virtual cloud control module 406 may be software applications implemented in computer instructions and executed by one or more processing devices of one or more servers 128 of the cloud-based computing system 116.

Figure 5:
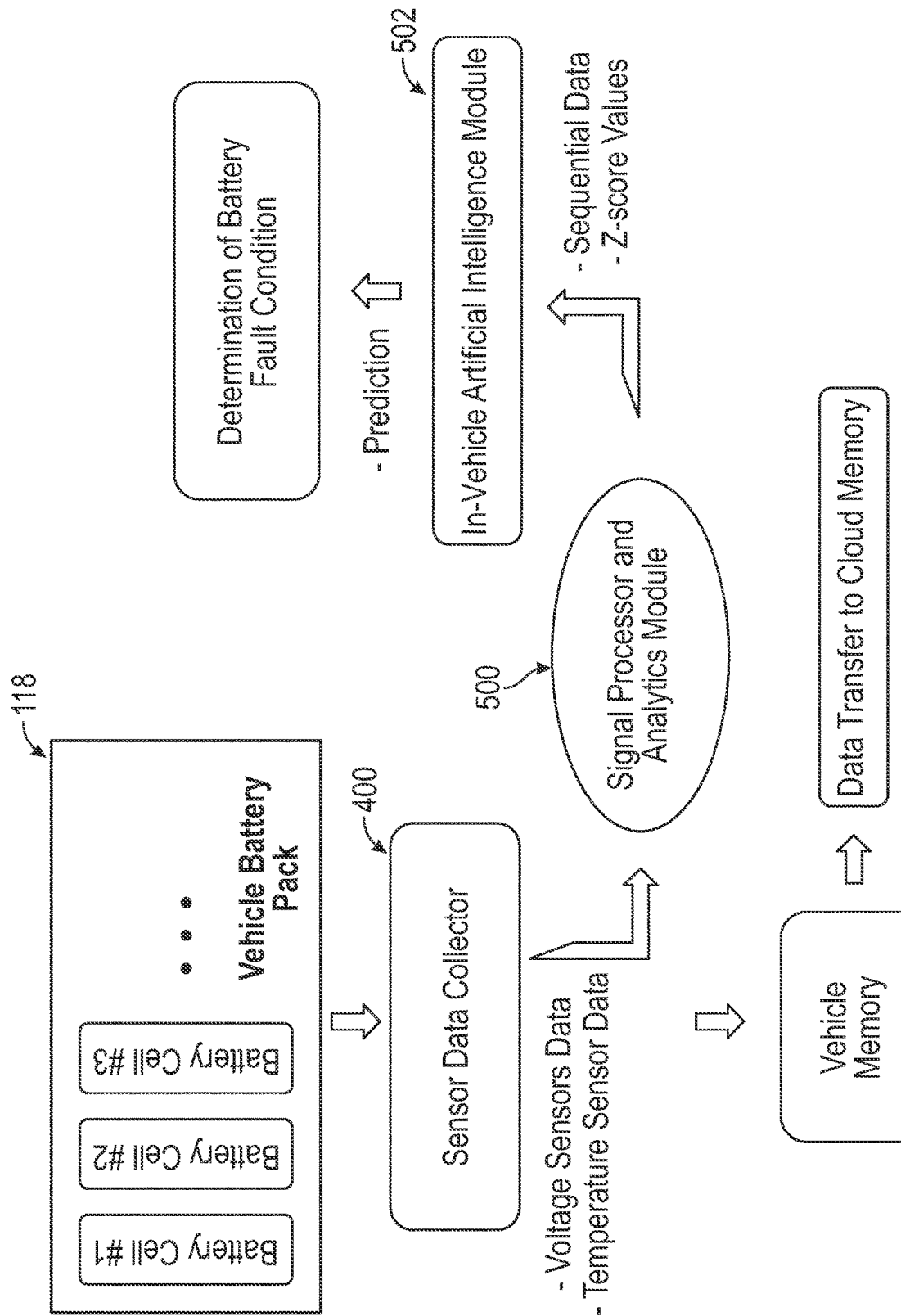
FIG. 5 illustrates an example block diagram for determining a battery fault condition using an in-vehicle computing device executing one or more machine learning models according to certain embodiments of this disclosure.

FIG. 5 illustrates an example block diagram for determining a battery fault condition using an in-vehicle computing device executing one or more machine learning models according to certain embodiments of this disclosure. As depicted, an in-vehicle battery pack 118 may include multiple battery cells that may be connected in both parallel and series configurations with built-in voltage and temperature sensors 131. The sensors 131 may measure the voltage and temperature values of each battery cell independently and the measurements may be received by the sensor data collector 400. The measurements from the voltage and temperature sensors may be transmitted to a signal processor and analytics module 500 for sequential data formatting and calculation of temperature and voltage scores (e.g., z-scores). In some embodiments, the sensor data collector 400 and/or the signal processor and analytics module 500 may be software applications implemented in computer instructions and executed by one or more processors associated with the vehicle 117 (e.g., computing device 102).

In some embodiments, the sequentially formatted (e.g., time-series sequential window format) measurement data and/or the z-scores may be used by one or more in-vehicle machine learning models (e.g., in-vehicle artificial intelligence module 502) to predict battery fault conditions. For example, the sequentially formatted time-series sensor measurements may be propagated over time by the one or more machine learning models to predict battery fault conditions (e.g., based on increasing or decreasing voltage and temperature z-scores over time, etc.). Additionally, in some embodiments, raw (e.g., unprocessed, unformatted, uncompressed, etc.) sensor measurements may be stored in an in-vehicle memory device and may be periodically transmitted to the cloud-based computing system 116. Such techniques may enable additional comprehensive analysis of the battery's performance over time. Detected battery faults and/or normal battery behavior may be identified and transmitted to the cloud-based computing system 116.

Figure 6:
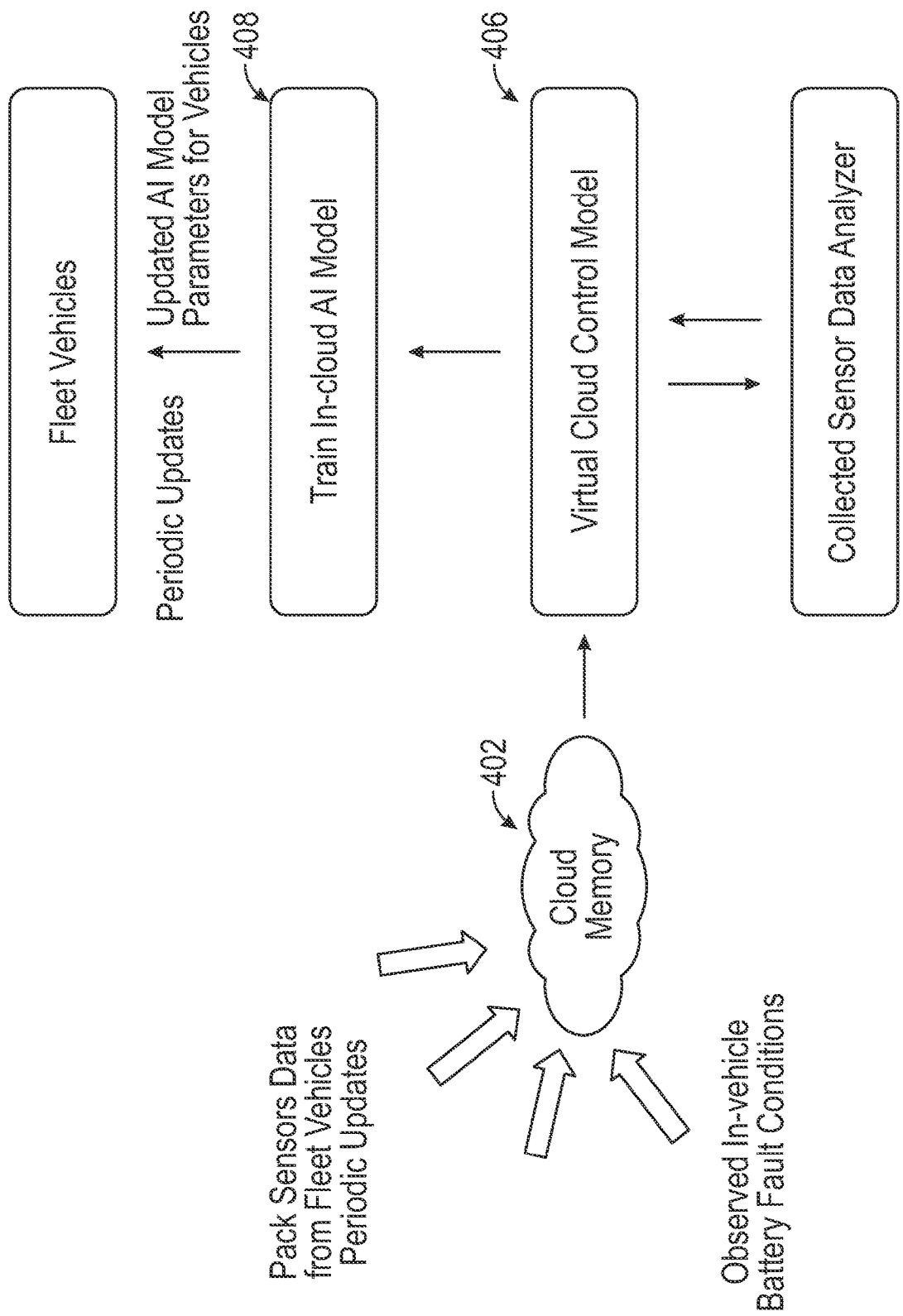
FIG. 6 illustrates an example block diagram for determining a battery fault condition using a cloud-based computing system executing one or more machine learning models according to certain embodiments of this disclosure.

FIG. 6 illustrates an example block diagram for determining a battery fault condition using a cloud-based computing system 116 executing one or more machine learning models 132 according to certain embodiments of this disclosure. As depicted, the cloud memory 402 (e.g., server 128, database 150, etc.) may store battery pack sensor measurement data from multiple vehicles (e.g., fleet vehicles) and may receive periodic updates as sensor measurements are obtained in real-time or near real-time. Real-time may refer to 2 seconds or less and near real-time may refer to between 2 and 20 seconds. Further, the cloud memory may store observed in-vehicle battery fault conditions that are detected by the one or more in-vehicle machine learning models. The virtual cloud control module 406 may access data stored in the cloud memory. The virtual cloud control module 406 may be a software application implemented in computer instructions and executed by one or more processing devices of one or more servers 128, for example. The virtual cloud control module 406 may include one or more machine learning models 132 that are trained to predict battery fault conditions based on the collected sensor data. As new sensor measurement data is received, the virtual cloud control module 406 may train 408 the one or more in-cloud machine learning models to update one or more parameters based on the new data. In other words, the virtual cloud control module 406 may pre-train one or more machine learning models using the latest sensor measurement data from the vehicles' battery packs. The updated parameters of the pre-trained machine learning models may be periodically transmitted to the fleet vehicles to enable the in-vehicle machine learning models' parameters to be updated. In some embodiments, the disclosed techniques may be used to identify battery faults before they occur and take preventative actions to attempt to prevent the faults. The preventative actions may include scheduling maintenance or repairing faulty battery cells, for example. As such, in some embodiments, the disclosed techniques may improve reliability and performance of electric vehicles while reducing maintenance costs and downtime.

The virtual cloud control module 406 may continuously refine and update the one or more in-cloud machine learning models' parameters based on sensor data received from a large pool of vehicles. This may enable the in-cloud machine learning models and the in-vehicle machine learning models to adapt to changing battery lifecycles and aging conditions, thereby improving accuracy of fault detection over time. By identifying battery faults before they occur, in some instances, and proactively taking measures (e.g., scheduling maintenance, repairing faulty battery cells, etc.) to prevent them, the trained machine learning models may help reduce maintenance costs and downtime. Additionally, by improving the reliability of electric vehicles, the trained machine learning models may enhance the electric vehicles overall performance and efficiency, which may lead to improved user experience. In some embodiments, the virtual cloud control module may selectively update the parameters in the in-cloud machine learning models based on specific driving patterns, preferences, and/or hardware limitations of certain vehicles. As such, personalized updates may be enabled that may further enhance the efficiency and effectiveness of the machine learning models.

Figure 7:
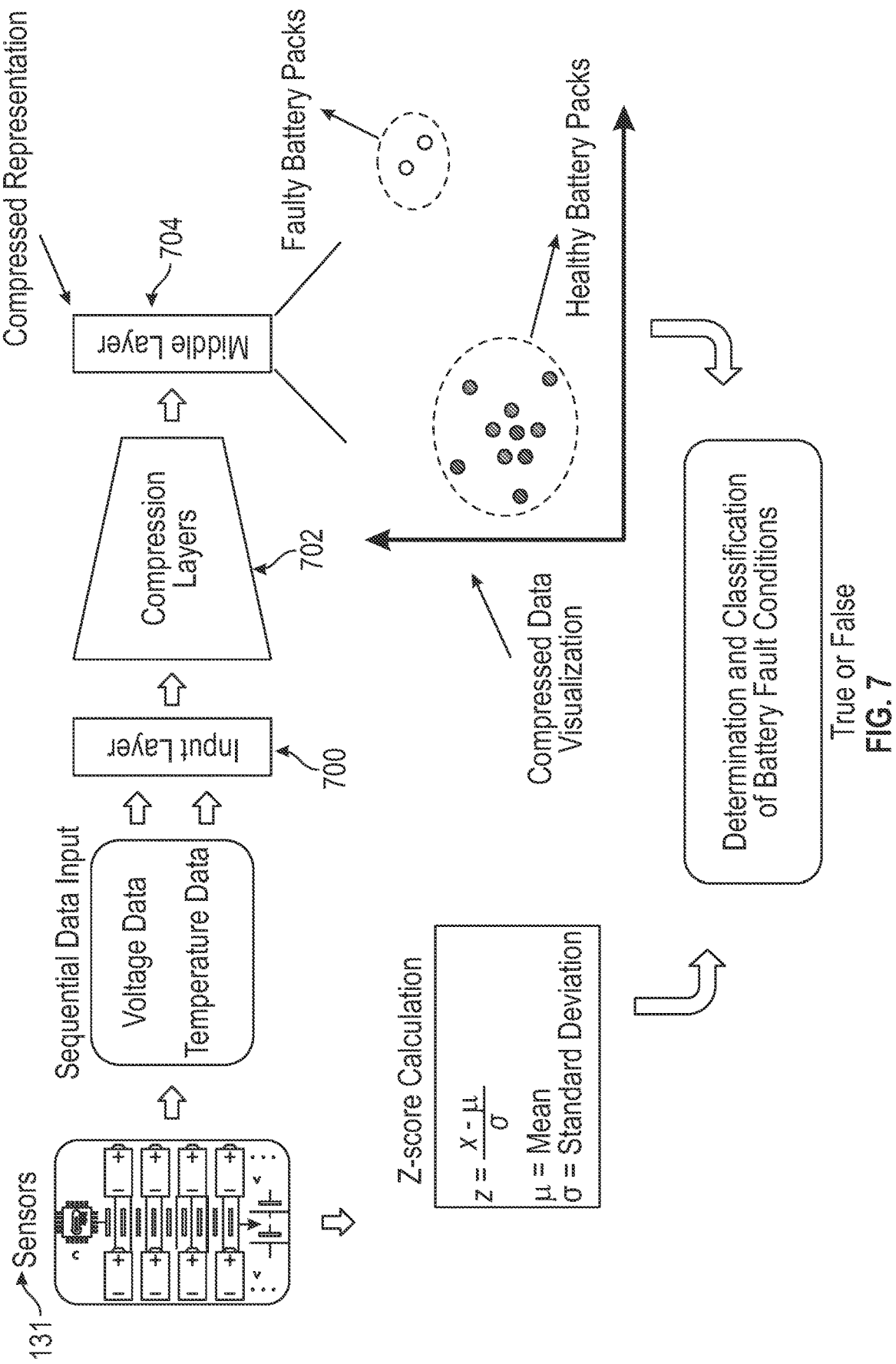
FIG. 7 illustrates an example architecture for one or more machine learning models executed by a computing device of a vehicle according to certain embodiments of this disclosure.

FIG. 7 illustrates an example architecture for one or more machine learning models executed by a computing device of a vehicle according to certain embodiments of this disclosure. The one or more machine learning models may include an input layer 700, a compression layer 702, and/or a middle layer 704. Sequential time-series window formatter sensor measurement data (e.g., voltage and temperature) may be input into the input layer 700. Further, one or more z-scores (e.g., voltage z-score and temperature z-score) may be determined based on the sensor measurement data and input into the input layer 700. The z-scores may represent the cell-to-cell sensor measurement data variations. The z-scores may be used to determine statistical difference between the measured value and the mean value of a reference sensor measurement. The z-scores may provide an indication of how far a measured value deviates from the average value based on historical data.

In some embodiments, the compression layer 702 may be used to compress time-variant high dimensional sensor measurement data into a lower dimensional feature space. The machine learning model parameters may be optimized to express high dimensional sensor measurement features in a compressed representation, extracting desired information for fault detection. The desired information that is compressed into the lower dimensional level may include value change details of the voltage and temperature over time. That is, compression may extract just the time-variant change details of the voltage and temperature and may exclude static data. In some embodiments, the low-dimensional extracted and compressed features may be concatenated with the temperature and voltage z-score values. The battery fault condition may be detected by the in-vehicle machine learning model based on the concatenated data. The z-score may provide a statistical basis for detecting anomalous behavior in the sensor measurements. Further, the z-scores may enable detection of fault conditions based on deviations from average behavior, rather than absolute values. The z-scores may be used to normalize sensor data across different battery packs, which may enable comparison and analysis of data from different sources.

Figure 8:
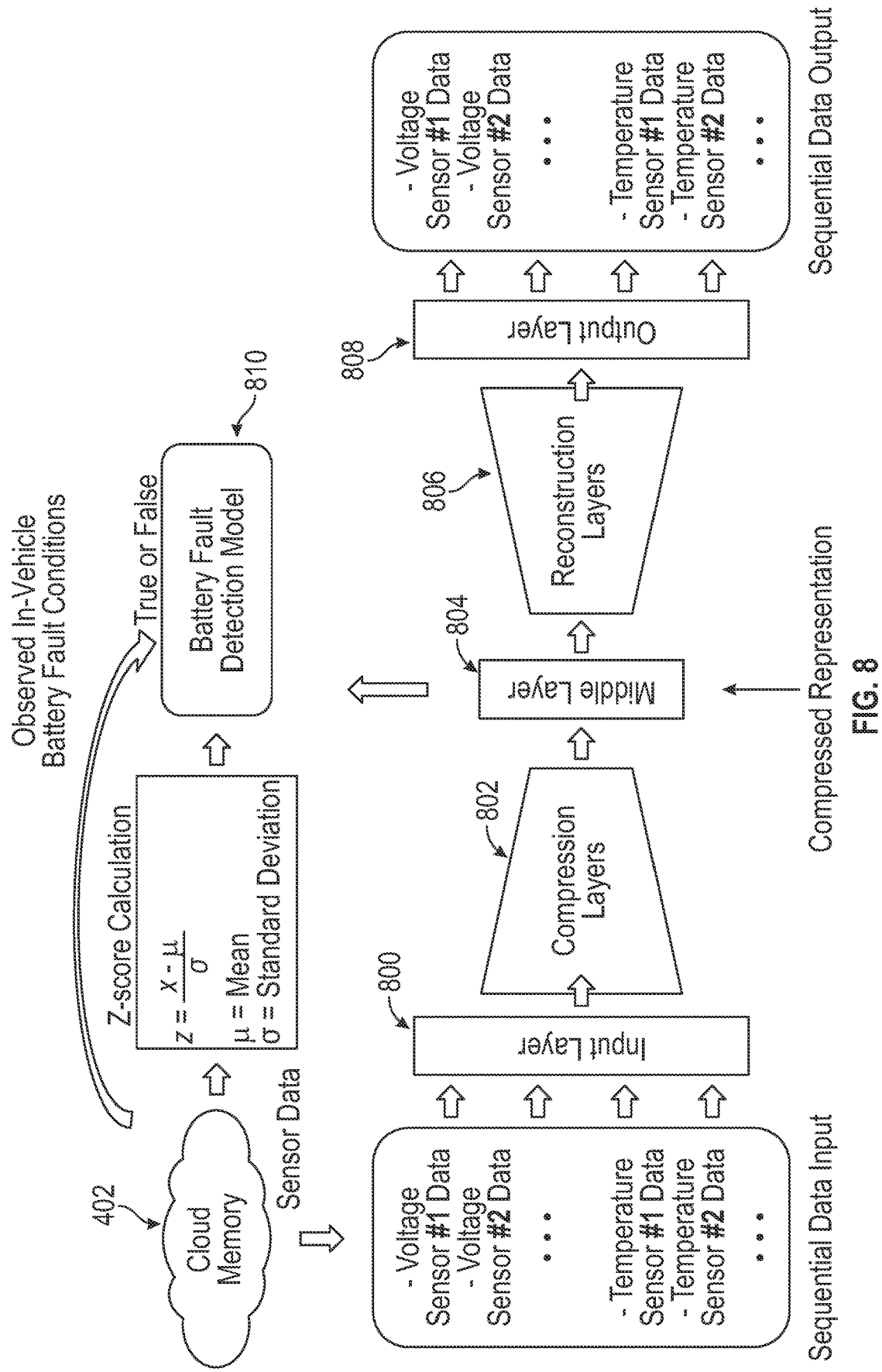
FIG. 8 illustrates an example architecture for one or more machine learning models executed by a cloud-based computing system according to certain embodiments of this disclosure.

FIG. 8 illustrates an example architecture for one or more machine learning models executed by a cloud-based computing system 116 according to certain embodiments of this disclosure. The one or more in-cloud machine learning models may include one or more input layers 800, compression layers 802, middle layers 804, reconstruction layers 806, and output layers 808. The one or more in-cloud machine learning models may be trained to predict potential battery faults before they occur by analyzing cell-to-cell variations (e.g., voltage z-scores and temperature z-scores) and general battery sensor information (e.g., compressed time-series data). The in-cloud machine learning models may identify the battery fault condition as either "true" or "false". The use of the one or more in-cloud machine learning models may enable periodic refinement and updating of the one or more in-vehicle machine learning models' parameters by incorporating information from multiple fleet vehicle sources. For example, by analyzing data from a large pool of vehicles, the cloud-based computing system 116 may selectively update parameters of the one or more in-vehicle machine learning models' parameters based on lifecycle degradation conditions of the battery packs, specific driving patterns, driving preferences, and/or hardware limitations of the electric vehicles. Such personalized updates may further enhance the efficiency and effectiveness of the in-vehicle and in-cloud machine learning models.

In some embodiments, the one or more in-cloud machine learning models process sequential time-series voltage and temperature sensor data from measurements stored in the cloud memory 402. The measurements may be processed through the input layer 800 and the compression layers 802. The resulting data represents a compressed representation of desired data in a low-dimensional space. The reconstruction layers 806 may reconstruct the time-series sequential sensor measurements from the compressed data representation and the output layer 808 may output the sequential data.

In some embodiments, the compressed representation of the sensor data may be used in loss calculation. The loss may be determined using mean squared error or mean absolute error. The loss may be used for machine learning model parameter optimization. A battery detection fault model layer 810 in the one or more in-cloud machine learning models may use the observed in-vehicle battery fault condition labels obtained from real fleet data for loss calculation. This technique may enable accurately training the in-cloud machine learning models to detect actual fault conditions that may occur in real-world scenarios. By using real-world data for loss calculation, the in-cloud machine learning models may be optimized to effectively classify and predict battery faults.

In some embodiments, the layers of the in-cloud machine learning models are optimized to express high dimensional sensor measurement features in a compressed representation, which extracts desired information (e.g., value changes in voltages and temperature over time) for fault detection. In some embodiments, backward propagation may be used to update the parameters of each layer of the in-cloud machine learning models to minimize the loss. In some embodiments, the loss function used for classification blocks may include binary cross-entropy loss. In addition to compressed feature inputs and z-score values, the battery fault detection model 810 may use the observed in-vehicle battery fault condition labels from real fleet vehicles for loss calculation. The loss function may be used for machine learning model parameter optimization. In some embodiments, the parameter optimization of the data reconstruction layers and classification layers may be performed separately. Initially, by using the large fleet data measurements, the reconstruction layer parameters may be trained and optimized periodically as new fleet measurements are stored in the cloud memory 402. In some embodiments, the compressed sequential sensor measurements are used as a time-variant features to the classification layers. The final output of the battery fault detection model 810 is a battery fault label "true" or "false".

Figure 9:
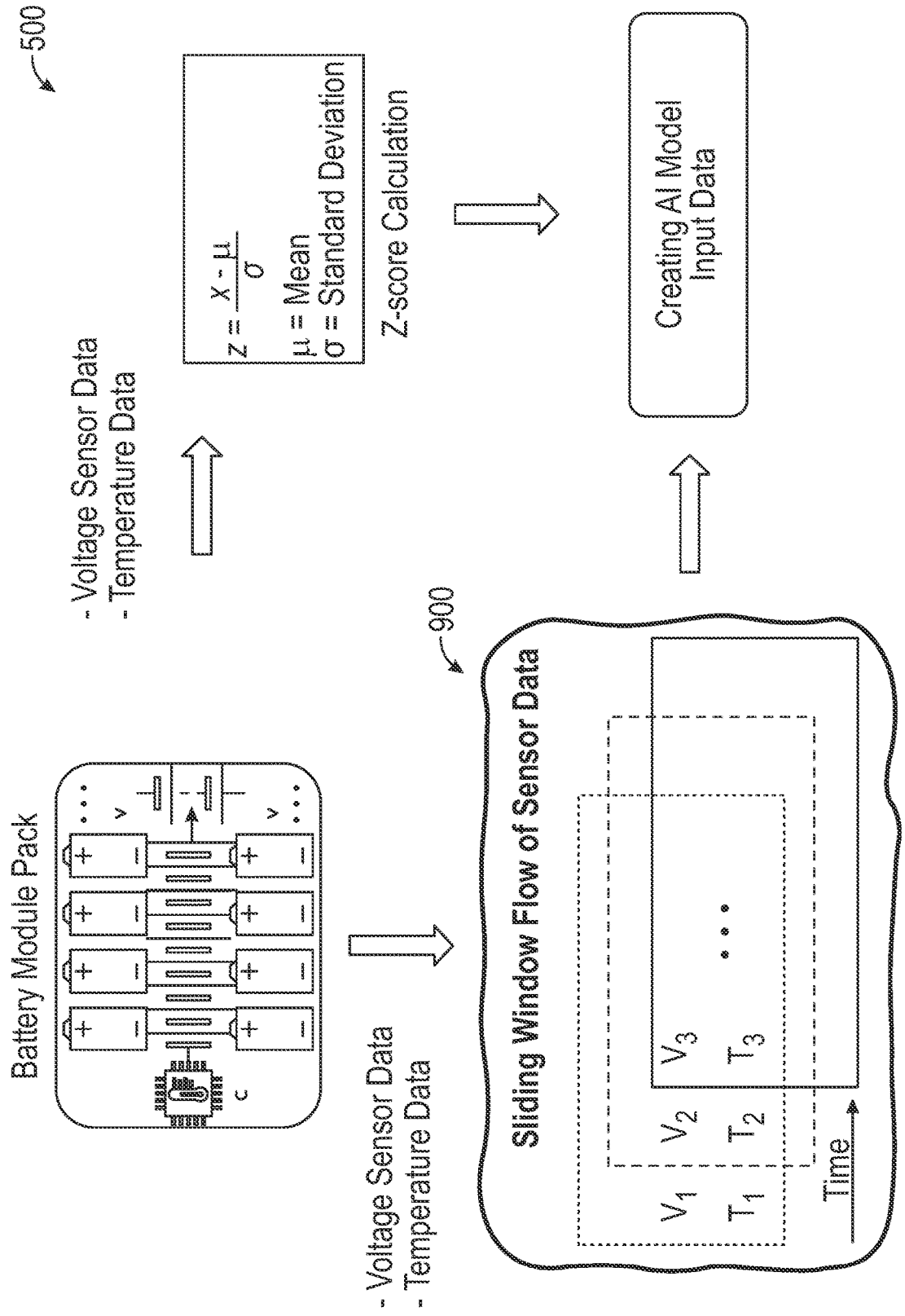
FIG. 9 illustrates an example block diagram of a signal processor and analytics module according to certain embodiments of this disclosure.

FIG. 9 illustrates an example block diagram of a signal processor and analytics module 500 according to certain embodiments of this disclosure. The signal processor and analytics module 500 may create the input data for the one or more in-vehicle machine learning models and the one or more in-cloud machine learning models. As such, the signal processor and analytics module 500 may be executed at both the vehicle 117 and the cloud-based computing system 116. The sensor measurements may include voltage sensor data and temperature sensor data. The signal processor and analytics module 500 may receive the measurement data from the sensors 131 and may transform the measurements into a time-series sequential window format 900, as depicted. The time-series sequential window format 900 may include a voltage measurement and a temperature measurement received at each time interval over a certain period of time. The time-series sequential window format 900 may represent a sliding window that may be adjusted based on the application or vehicle type. Since voltage and temperature measurements are time-series data, formatting the sensor measurements into a window sequence arranged in time-increasing format may enable the extraction of time-dependent, high-dimensional features. Further, the signal processor and analytics module 500 may determine the z-scores for both voltage and temperature. The sequential time-series sensor data and cell-to-cell variations of voltage and temperature (e.g., voltage z-score and temperature z-score) may be input into the one or more in-vehicle and in-cloud machine learning models to detect battery fault conditions.

In some embodiments, the signal processor and analytics module 500 may be used to train and optimize the in-cloud machine learning models' parameters, which may be periodically transmitted to update the parameters of the in-vehicle machine learning model. Such a technique may enable operating the one or more in-vehicle machine learning models with the most up-to-date parameters, which may improve detection accuracy and efficiency and may enable addressing potential cell faults with the battery packs.

Figure 10A:
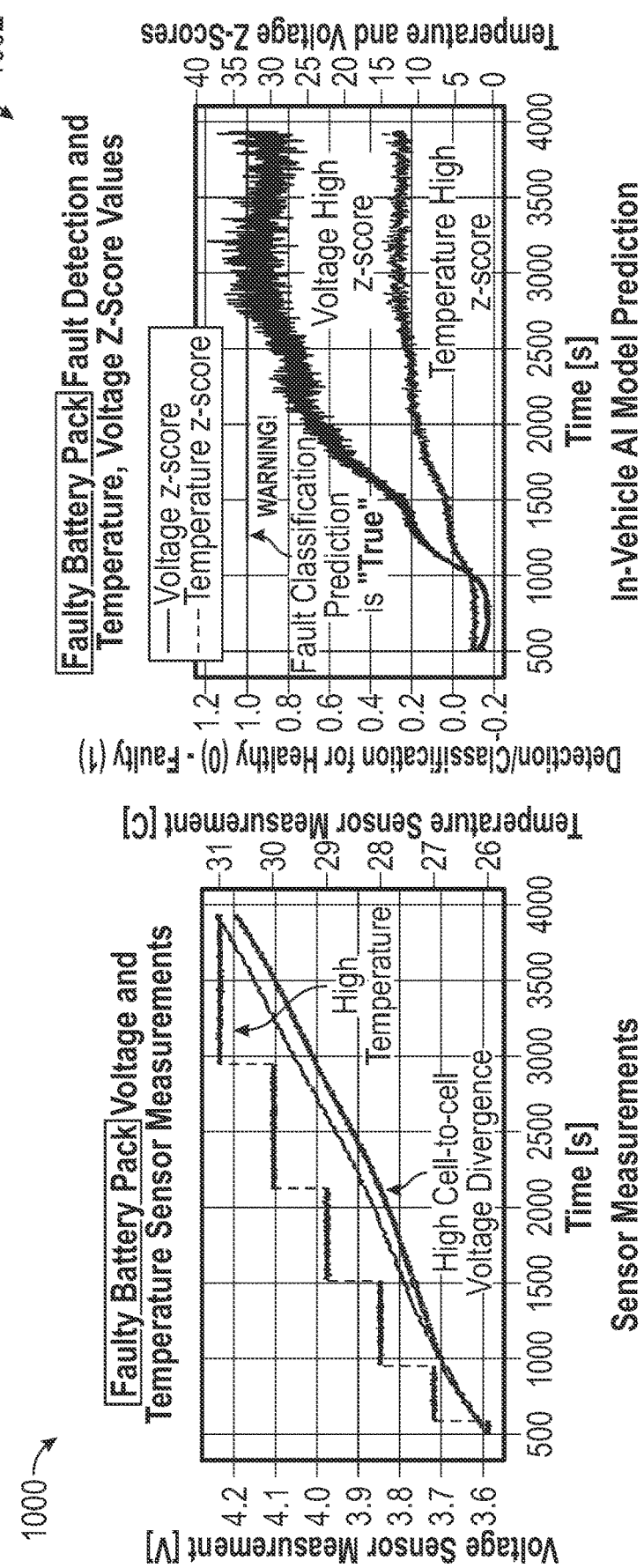
FIGS. 10A-B illustrates example graphs representing predictions according to certain embodiments of this disclosure.
Figure 10B:
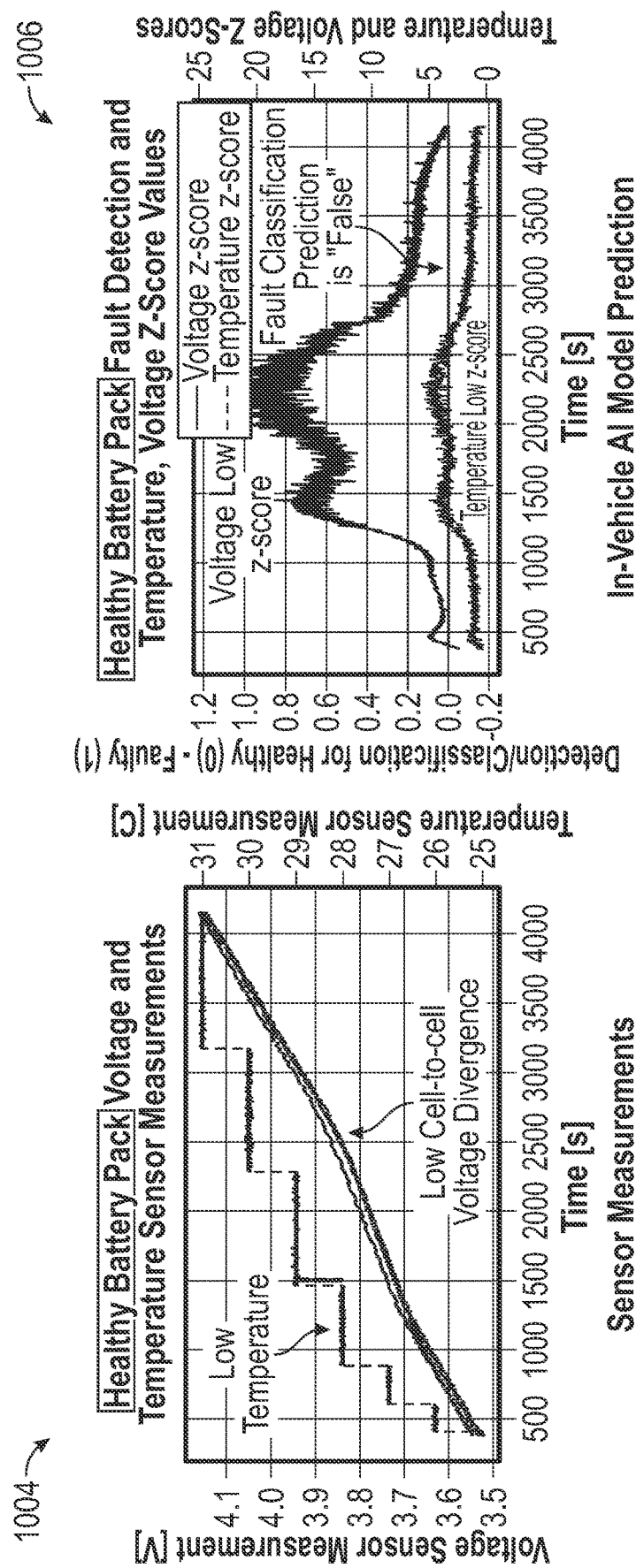

FIGS. 10A-B illustrates example graphs representing predictions according to certain embodiments of this disclosure. During the charging event of two electric vehicle battery packs, the voltage and temperature measurements along with the voltage z-score and temperature z-scores are plotted in FIGS. 10A and 10B. As depicted in graph 1002 of FIG. 10A, the in-vehicle machine learning model accurately predicts the fault of the battery pack based on the sequential sensor data input and the z-scores of temperature and voltage. Further, as depicted in graph 1000 of FIG. 10A, the divergence in cell-to-cell voltage measurements starts to increase after fault detection shown in graph 1002. However, in the case of low temperature (as indicated in temperature y-axis values in graph 1004 of FIG. 10B), even with cell-to-cell voltage measurements diverging, the in-vehicle machine learning model does not predict the battery to be faulty. Such a scenario may be attributed to the presence of cell imbalance within the battery pack, which may be a common occurrence. Some embodiments of the present disclosure may be robust against falsely detecting cell imbalances as battery faults. As depicted in graph 1006 of FIG. 10B the in-vehicle machine learning model predicts a healthy battery pack (e.g., outputs a "false" for fault detection) even when there exists a cell-to-cell divergence in the battery pack. A likely reason for this is that the temperature and voltage z-scores are relatively low compared to a faulty battery pack. Additionally, another reason for predicting a healthy battery pack may be due to the compressed sequential input data.

Figure 11:
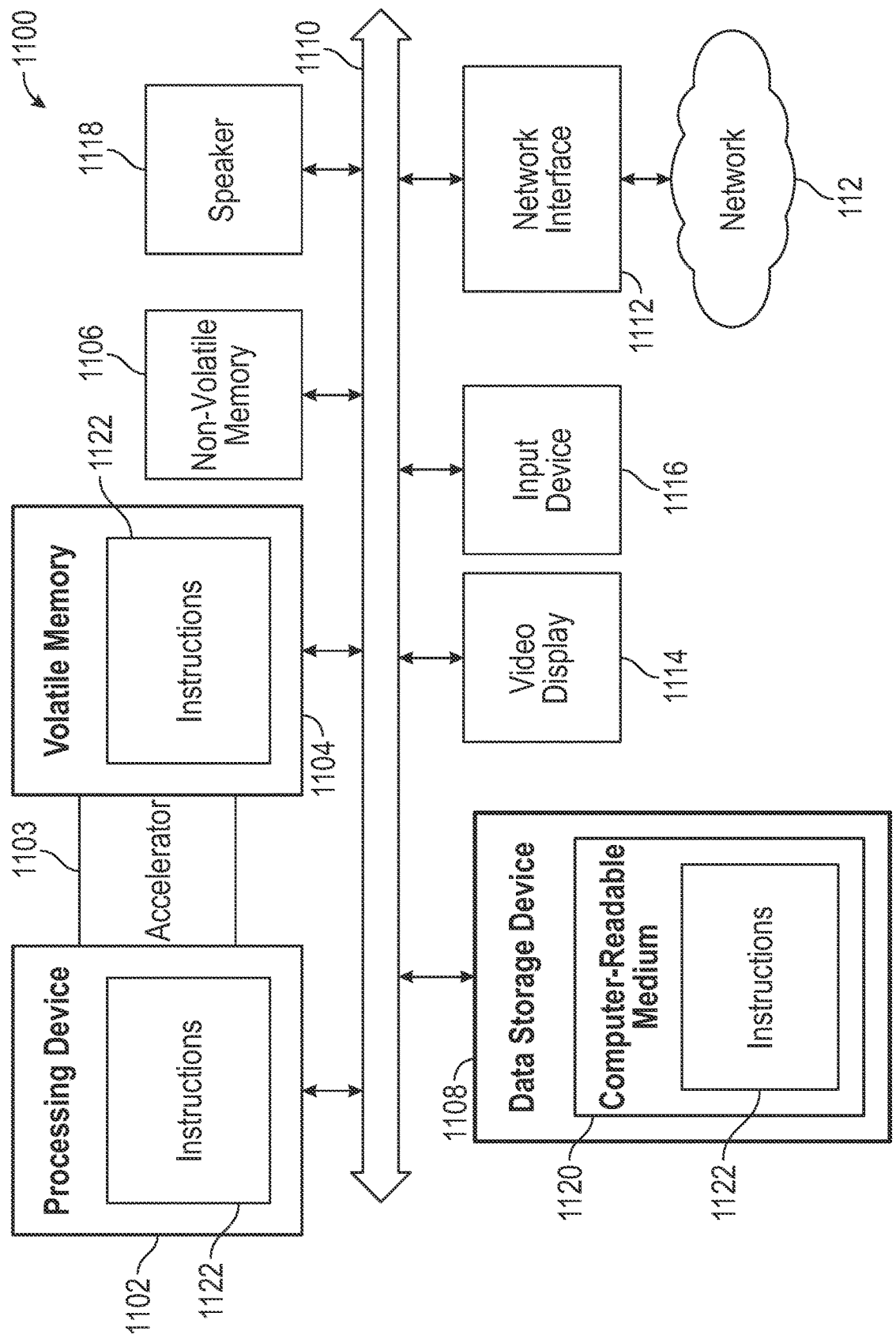
FIG. 11 illustrates an example computer system according to certain embodiments of this disclosure.

FIG. 11 illustrates example computer system 1100 which can perform any one or more of the methods described herein, in accordance with one or more aspects of the present disclosure. In one example, computer system 1100 may correspond to the computing device 102 (e.g., user computing device), one or more servers 128 of the cloud-based computing system 116, the training engine 130, any component of the vehicle 117, or any suitable component of FIG. 1. The computer system 1100 may be capable of executing the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 1100 includes a processing device 1102, a volatile memory 1104 (e.g., random access memory (RAM)), a non-volatile memory 1106 (e.g., read-only memory (ROM), flash memory, solid state drives (SSDs), and a data storage device 1108, the foregoing of which are enabled to communicate with each other via a bus 1110.

Processing device 1102 represents one or more general-purpose processing devices such as a microprocessor, central processing unit, or the like. More particularly, the processing device 1102 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 1102 may also be one or more special-purpose processing devices such as an application specific integrated circuit (ASIC), a system on a chip, a field programmable gate array (FPGA), a digital signal processor (DSP), network processor, or the like. The processing device 1102 may include more than one processing device, and each of the processing devices may be the same or different types. The processing device 1102 may include or be communicatively coupled to one or more accelerators 1103 configured to offload various data-processing tasks from the processing device 1102. The processing device 1102 is configured to execute instructions for performing any of the operations and steps discussed herein.

The computer system 1100 may further include a network interface device 1112. The network interface device 1112 may be configured to communicate data via any suitable communication protocol. In some embodiments, the network interface devices 1112 may enable wireless (e.g., WiFi, Bluetooth, ZigBee, etc.) or wired (e.g., Ethernet, etc.) communications. The computer system 1100 also may include a video display 1114 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 1116 (e.g., a keyboard or a mouse), and one or more speakers 1118 (e.g., a speaker). In one illustrative example, the video display 1114 and the input device(s) 1116 may be combined into a single component or device (e.g., an LCD touch screen).

The output device 1150 may transmit and receive data from a computer system application programming interface (API). The data may pertain to any suitable information described herein, such as a remaining useful life of a battery pack, among other information.

The data storage device 1108 may include a computer-readable medium 1120 on which the instructions 1122 embodying any one or more of the methods, operations, or functions described herein is stored. The instructions 1122 may also reside, completely or at least partially, within the volatile memory 1104 or within the processing device 1102 during execution thereof by the computer system 1100. As such, the volatile memory 1104 and the processing device 1102 also constitute computer-readable media. The instructions 1122 may further be transmitted or received over a network via the network interface device 1112.

While the computer-readable storage medium 1120 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

Consistent with the above disclosure, the examples of systems and method enumerated in the following clauses are specifically contemplated and are intended as a non-limiting set of examples.

1. A computer-implemented method comprising:
   receiving, from one or more sensors associated with a battery pack, one or more measurements pertaining to voltage, temperature, or both;
   transforming the one or more measurements into a time-series sequential window format;
   determining, based on the time-series sequential window format of the one or more measurements, a voltage score and a temperature score;
   predicting, based on the voltage score and the temperature score, whether the battery pack is experiencing a fault condition, wherein the prediction is performed by one or more trained machine learning models; and
   responsive to predicting the battery pack is experiencing the fault condition, performing one or more preventative actions.

2. The computer-implemented method of any clause herein, wherein the one or more measurements are received while the battery pack is charging.

3. The computer-implemented method of any clause herein, wherein the battery pack comprises a plurality of cells and the one or more measurements are received for each of the plurality of cells, and the method further comprises comparing the one or more measurements for each of the plurality of cells.

4. The computer-implemented method of any clause herein, further comprising transmitting the one or more measurements to a cloud-based computing system, wherein the cloud-based computing system uses the one or more measurements to train one or more cloud-based machine learning models configured to predict the fault condition.

5. The computer-implemented method of any clause herein, wherein the voltage score and the temperature score are z-score values that represent cell-to-cell variation in the battery pack.

6. The computer-implemented method of any clause herein, further comprising compressing the time-series sequential window flow format of the one or more measurements from a higher dimension level to a lower dimension level.

7. The computer-implemented method of any clause herein, wherein the one or more preventative actions comprise scheduling maintenance of the battery pack, repairing the battery pack, replacing the battery pack, or some combination thereof.

8. One or more non-transitory, tangible computer-readable media storing instructions that, when executed, cause one or more processing devices to:
   receive, from one or more sensors associated with a battery pack, one or more measurements pertaining to voltage, temperature, or both;
   transform the one or more measurements into a time-series sequential window format;
   determine, based on the time-series sequential window format of the one or more measurements, a voltage score and a temperature score;
   predict, based on the voltage score and the temperature score, whether the battery pack is experiencing a fault condition, wherein the prediction is performed by one or more trained machine learning models; and
   responsive to predicting the battery pack is experiencing the fault condition, perform one or more preventative actions.

9. The one or more computer-readable media of any clause herein, wherein the one or more measurements are received while the battery pack is charging.

10. The one or more computer-readable media of any clause herein, wherein the battery pack comprises a plurality of cells and the one or more measurements are received for each of the plurality of cells, and the one or more processing devices are further configured to compare the one or more measurements for each of the plurality of cells.

11. The one or more computer-readable media of any clause herein, further comprising transmitting the one or more measurements to a cloud-based computing system, wherein the cloud-based computing system uses the one or more measurements to train one or more cloud-based machine learning models configured to predict the fault condition.

12. The one or more computer-readable media of any clause herein, wherein the voltage score and the temperature score are z-score values that represent cell-to-cell variation in the battery pack.

13. The one or more computer-readable media of any clause herein, further comprising compressing the time-series sequential window flow format of the one or more measurements from a higher dimension level to a lower dimension level.

14. The one or more computer-readable media of any clause herein, wherein the one or more preventative actions comprise scheduling maintenance of the battery pack, repairing the battery pack, replacing the battery pack, or some combination thereof.

15. A system comprising:
one or more memory devices storing instructions; and
one or more processing devices communicatively coupled to the one or more memory devices, wherein the one or more processing devices execute the instructions to:
receive, from one or more sensors associated with a battery pack, one or more measurements pertaining to voltage, temperature, or both;
transform the one or more measurements into a time-series sequential window format;
determine, based on the time-series sequential window format of the one or more measurements, a voltage score and a temperature score;
predict, based on the voltage score and the temperature score, whether the battery pack is experiencing a fault condition, wherein the prediction is performed by one or more trained machine learning models; and
responsive to predicting the battery pack is experiencing the fault condition, perform one or more preventative actions.

16. The system of any clause herein, wherein the one or more measurements are received while the battery pack is charging.

17. The system of any clause herein, wherein the battery pack comprises a plurality of cells and the one or more measurements are received for each of the plurality of cells, and the one or more processing devices are further configured to compare the one or more measurements for each of the plurality of cells.

18. The system of any clause herein, further comprising transmitting the one or more measurements to a cloud-based computing system, wherein the cloud-based computing system uses the one or more measurements to train one or more cloud-based machine learning models configured to predict the fault condition.

19 The system of any clause herein, wherein the voltage score and the temperature score are z-score values that represent cell-to-cell variation in the battery pack.

20. The system of any clause herein, further comprising compressing the time-series sequential window flow format of the one or more measurements from a higher dimension level to a lower dimension level.

21. A computer-implemented method comprising:
receiving, at a cloud-based computing system, a plurality of measurements over a certain period of time, wherein the plurality of measurements are received from a plurality of vehicles and pertain to voltages and temperatures of a plurality of battery packs associated with the plurality of vehicles;
training, using the plurality of measurements, one or more machine learning models to predict a battery pack fault condition, wherein the one or more machine learning models comprise a plurality of parameters that are modified during the training; and
transmitting the plurality of parameters to the plurality of vehicles to enable the plurality of vehicles to update, based on the plurality of parameters, one or more respective in-vehicle machine learning models configured to predict the battery pack fault condition.

22. The computer-implemented method of any clause herein, further comprising compressing the plurality of measurements from higher dimensional level data to lower dimensional level data.

23. The computer-implemented method of any clause herein, further comprising determining, based on the lower dimensional level data, a loss associated with compressing the plurality of measurements.

24. The computer-implemented method of any clause herein, further comprising optimizing the plurality of parameters by back propagation to minimize the loss.

25. The computer-implemented method of any clause herein, wherein the one or more machine learning models comprise a non-linear 2-layer fully connected neural network.

26. The computer-implemented method of any clause herein, further comprising:
receiving a plurality of fault condition classifications from a plurality of in-vehicle machine learning models; and
training, using the plurality of fault condition classifications and the plurality of measurements, the one or more machine learning models to predict the battery pack fault condition.

27. The computer-implemented method of any clause herein, further comprising determining, at the cloud-based computing system, one or more voltage scores and one or more temperature scores based on the plurality of measurements, wherein the one or more voltage scores and the one or more temperature scores are used to extract cell-to-cell variations of the plurality of battery packs.

28. One or more non-transitory, tangible computer-readable media storing instructions that, when executed, cause one or more processing devices to:
receive, at a cloud-based computing system, a plurality of measurements over a certain period of time, wherein the plurality of measurements are received from a plurality of vehicles and pertain to voltages and temperatures of a plurality of battery packs associated with the plurality of vehicles;
train, using the plurality of measurements, one or more machine learning models to predict a battery pack fault condition, wherein the one or more machine learning models comprise a plurality of parameters that are modified during the training; and
transmit the plurality of parameters to the plurality of vehicles to enable the plurality of vehicles to update, based on the plurality of parameters, one or more respective in-vehicle machine learning models configured to predict the battery pack fault condition.

29. The one or more computer-readable media of claim 8, wherein the one or more processing devices are further configured to compress the plurality of measurements from higher dimensional level data to lower dimensional level data.

30. The one or more computer-readable media of any clause herein, wherein the one or more processing devices are further configured to determine, based on the lower dimensional level data, a loss associated with compressing the plurality of measurements.

31. The one or more computer-readable media of any clause herein, wherein the one or more processing devices are further configured to optimize the plurality of parameters by back propagation to minimize the loss.

32 The one or more computer-readable media of any clause herein, wherein the one or more machine learning models comprise a non-linear 2-layer fully connected neural network.

33. The one or more computer-readable media of any clause herein, wherein the one or more processing devices are further configured to:
    receive a plurality of fault condition classifications from a plurality of in-vehicle machine learning models; and
    train, using the plurality of fault condition classifications and the plurality of measurements, the one or more machine learning models to predict the battery pack fault condition.
34. The one or more computer-readable media of any clause herein, wherein the one or more processing devices are further configured to determine, at the cloud-based computing system, one or more voltage scores and one or more temperature scores based on the plurality of measurements, wherein the one or more voltage scores and the one or more temperature scores are used to extract cell-to-cell variations of the plurality of battery packs.
35. A system comprising:
    one or more memory devices storing instructions; and
    one or more processing devices communicatively coupled to the one or more memory devices, wherein the one or more processing devices execute the instructions to:
    receive, at a cloud-based computing system, a plurality of measurements over a certain period of time, wherein the plurality of measurements are received from a plurality of vehicles and pertain to voltages and temperatures of a plurality of battery packs associated with the plurality of vehicles;
    train, using the plurality of measurements, one or more machine learning models to predict a battery pack fault condition, wherein the one or more machine learning models comprise a plurality of parameters that are modified during the training; and
    transmit the plurality of parameters to the plurality of vehicles to enable the plurality of vehicles to update, based on the plurality of parameters, one or more respective in-vehicle machine learning models configured to predict the battery pack fault condition.
36. The system of any clause herein, wherein the one or more processing devices are further configured to compress the plurality of measurements from higher dimensional level data to lower dimensional level data.
37. The system of any clause herein, wherein the one or more processing devices are further configured to determine, based on the lower dimensional level data, a loss associated with compressing the plurality of measurements.
38. The system of any clause herein, wherein the one or more processing devices are further configured to optimize the plurality of parameters by back propagation to minimize the loss.
39. The system of any clause herein, wherein the one or more machine learning models comprise a non-linear 2-layer fully connected neural network.
40. The system of any clause herein, wherein the one or more processing devices are further configured to:
    receive a plurality of fault condition classifications from a plurality of in-vehicle machine learning models; and
    train, using the plurality of fault condition classifications and the plurality of measurements, the one or more machine learning models to predict the battery pack fault condition.

What is claimed is:

1. A computer-implemented method comprising:
    receiving, from one or more sensors associated with a battery pack, one or more measurements pertaining to voltage, temperature, or both;
    transforming the one or more measurements into a time-series sequential window format;
    determining, based on the time-series sequential window format of the one or more measurements, a voltage score and a temperature score;
    predicting, based on the voltage score and the temperature score, whether the battery pack is experiencing a fault condition comprising a short circuit, a thermal condition, or both, wherein the prediction is performed by one or more trained machine learning models; and
    responsive to predicting the battery pack is experiencing the fault condition, controlling, via a processing device, an operating parameter of the battery pack.

2. The computer-implemented method of claim 1, wherein the one or more measurements are received while the battery pack is charging.

3. The computer-implemented method of claim 1, wherein the battery pack comprises a plurality of cells and the one or more measurements are received for each of the plurality of cells, and the method further comprises comparing the one or more measurements for each of the plurality of cells.

4. The computer-implemented method of claim 1, further comprising transmitting the one or more measurements to a cloud-based computing system, wherein the cloud-based computing system uses the one or more measurements to train one or more cloud-based machine learning models configured to predict the fault condition.

5. The computer-implemented method of claim 1, wherein the voltage score and the temperature score are z-score values that represent cell-to-cell variation in the battery pack.

6. The computer-implemented method of claim 1, further comprising compressing the time-series sequential window flow format of the one or more measurements from a higher dimension level to a lower dimension level.

7. The computer-implemented method of claim 1, responsive to predicting the battery pack is experiencing the fault condition, further comprising scheduling maintenance of the battery pack, repairing the battery pack, replacing the battery pack, or some combination thereof.

8. One or more non-transitory, tangible computer-readable media storing instructions that, when executed, cause one or more processing devices to:
    receive, from one or more sensors associated with a battery pack, one or more measurements pertaining to voltage, temperature, or both;
    transform the one or more measurements into a time-series sequential window format;
    determine, based on the time-series sequential window format of the one or more measurements, a voltage score and a temperature score;
    predict, based on the voltage score and the temperature score, whether the battery pack is experiencing a fault condition comprising a short circuit, a thermal condition, or both, wherein the prediction is performed by one or more trained machine learning models; and
    responsive to predicting the battery pack is experiencing the fault condition, controlling, via a processing device, an operating parameter of the battery pack.

9. The one or more computer-readable media of claim 8, wherein the one or more measurements are received while the battery pack is charging.

10. The one or more computer-readable media of claim 8, wherein the battery pack comprises a plurality of cells and the one or more measurements are received for each of the plurality of cells, and the one or more processing devices are further configured to compare the one or more measurements for each of the plurality of cells.

11. The one or more computer-readable media of claim 8, further comprising transmitting the one or more measurements to a cloud-based computing system, wherein the cloud-based computing system uses the one or more measurements to train one or more cloud-based machine learning models configured to predict the fault condition.

12. The one or more computer-readable media of claim 8, wherein the voltage score and the temperature score are z-score values that represent cell-to-cell variation in the battery pack.

13. The one or more computer-readable media of claim 8, further comprising compressing the time-series sequential window flow format of the one or more measurements from a higher dimension level to a lower dimension level.

14. The one or more computer-readable media of claim 8, responsive to predicting the battery pack is experiencing the fault condition, scheduling maintenance of the battery pack, repairing the battery pack, replacing the battery pack, or some combination thereof.

15. A system comprising:
one or more memory devices storing instructions; and
one or more processing devices communicatively coupled to the one or more memory devices, wherein the one or more processing devices execute the instructions to:
receive, from one or more sensors associated with a battery pack, one or more measurements pertaining to voltage, temperature, or both;
transform the one or more measurements into a time-series sequential window format;
determine, based on the time-series sequential window format of the one or more measurements, a voltage score and a temperature score;
predict, based on the voltage score and the temperature score, whether the battery pack is experiencing a fault condition comprising a short circuit, a thermal condition, or both, wherein the prediction is performed by one or more trained machine learning models; and
responsive to predicting the battery pack is experiencing the fault condition, controlling, via a processing device, an operating parameter of the battery pack.

16. The system of claim 15, wherein the one or more measurements are received while the battery pack is charging.

17. The system of claim 15, wherein the battery pack comprises a plurality of cells and the one or more measurements are received for each of the plurality of cells, and the one or more processing devices are further configured to compare the one or more measurements for each of the plurality of cells.

18. The system of claim 15, further comprising transmitting the one or more measurements to a cloud-based computing system, wherein the cloud-based computing system uses the one or more measurements to train one or more cloud-based machine learning models configured to predict the fault condition.

19. The system of claim 15, wherein the voltage score and the temperature score are z-score values that represent cell-to-cell variation in the battery pack.

20. The system of claim 15, further comprising compressing the time-series sequential window flow format of the one or more measurements from a higher dimension level to a lower dimension level.

* * * * *